United States Patent [19]  [11] 4,073,657
Davis et al.  [45] Feb. 14, 1978

[54] GLASS FOR SEMICONDUCTORS

[75] Inventors: Earl Klimer Davis, Tempe; William Oakley Rogers, Mesa; Duane Charles Silvis, Scottsdale, all of Ariz.

[73] Assignee: Motorola, Inc., Schaumburg, Ill.

[21] Appl. No.: 705,968

[22] Filed: July 16, 1976

[51] Int. Cl.² .......................... C03C 3/04; C03C 3/10; A01L 3/00
[52] U.S. Cl. ............................... 106/73.5; 106/47 R; 106/49; 106/53; 357/73
[58] Field of Search ................ 106/73.5, 49, 53, 47 R

[56] References Cited

U.S. PATENT DOCUMENTS

| | | | |
|---|---|---|---|
| 3,723,835 | 3/1973 | Davis et al. | 106/49 X |
| 3,963,505 | 6/1976 | Dumesnil | 106/53 X |
| 3,964,920 | 6/1976 | Davis et al. | 106/53 |

*Primary Examiner*—Helen M. McCarthy
*Attorney, Agent, or Firm*—John A. Fisher

[57] ABSTRACT

An insulating or passivation glass consisting of 36 to 40 volume percent zircon and the balance is a base glass consisting essentially of 2 to 6 percent-$SiO_2$, 70 to 75 percent-PbO 5 to 9 percent-ZnO, 0 to 4 percent-BaO, 2 to 5 percent-CdO, 0 to 2 percent-$TiO_2$ and 10 to 14 percent-$B_2O_3$, all of said percentages being weight percent.

1 Claim, No Drawings

GLASS FOR SEMICONDUCTORS

BACKGROUND OF THE INVENTION

This invention relates to semiconductor devices and more particularly to a passivating and insulating glass for semiconductor devices.

In the manufacture of semiconductor devices, there is a need for an insulating and passivating glass which can be applied at low temperature i.e., less than 577° C, in relatively thick layers i.e., layers of the order of 10 to 15 microns. Most low temperature glasses that are commonly available will crack when applied in a layer of more than 5 microns.

In U.S. Pat. No. 3,964,920 Davis et al there is taught a solder glass for sealing ceramic parts together which is a low melting point glass and has been used in a great advantage for the sealing of such ceramic parts. It was found to be unsuitable for passivation and insulating purposes because of low electrical resistance resulting from unwanted devitrification of the glass.

Accordingly, it is an object of this invention to provide an improved low melting point glass. It is a further object of this invention to provide a low melting point glass which is suitable for providing relatively thick insulating and passivating layers on semiconductor devices.

SUMMARY OF THE INVENTION

In accordance with the invention there is provided a low melting point glass for semiconductors consisting of 36 to 40 volume percent zircon and a balance a base glass of 2 to 6 percent-$SiO_2$, 70 to 75 percent-PbO, 5 to 9 percent-ZnO, 0 to 4 percent-BaO, 2 to 5 percent-CdO, 0 to 2 percent-$TiO_2$ and 10 to 14 percent-$B_2O_3$, all of said percentages being weight percent.

COMPLETE DESCRIPTION

Dielectric coatings on silicon are useful for electrical insulation and passivation in electronic applications. Most glasses that are soft enough to enamel at not over 577° C (the eutectic temperature of silicon and aluminum) have an expansion of at least $60 \times 10^{-7}$ per ° C from 25° C to 300° C compared to about $35 \times 10^{-7}$ per ° C for silicon.

Except for thin coatings of glass on silicon of about 5 microns or less, cracking difficulties are encountered whenever a glass in this expansion range is enameled on silicon. This is attributed to the strength of the glass being less than the tensile stress resulting from the higher expansion of the glass.

For use in a semiconductor device the following characteristics are needed for the dielectric material:

1. A combination of strength and thermal expansion match for silicon that makes possible coatings up to about 15 microns without encountering a cracking problem.

2. Good enameling characteristics that is: continuous coatings and good adherence to its substrate material (aluminum coated silicon) when fired at a temperature not exceeding 577° C; the eutectic temperature of silicon and aluminum. Also the glass must be capable of withstanding up to about 30 minutes at the firing temperature to accommodate simultaneously sintering the aluminum coating on the silicon.

3. Electrical insulation.

4. The material must be suitable for applying a metal coating, such as chromium, onto the glass by an evaporation process.

5. The material must have sufficient chemical durability to withstand the etchants used to obtain the desired pattern of any metal coating on the dielectric material.

6. The material must be suitable for the application of the dielectric material in a desired pattern by a photoresist process. This requires the glass to tolerate the photoresist removal at an approximate temperature of 350° C. Glasses that have an anneal point below about 350° C are unsuitable.

It has been found that a novel glass composition having suitable characteristics are variations of a solder glass of the lead-zinc-borate type consisting of 36 to 40 percent ziron (zirconium silicate) added to a base lead-zinc-borate glass having a composition of 2 to 6 percent-$SiO_2$, 70 to 75 percent-PbO, 5 to 9 percent-ZnO, 0 to 4 percent-BaO, 2 to 5 percent-CdO, 0 to 2 percent-$TiO_2$ and 10 to 14 percent-$B_2O_3$.

The required resistance to devitrification, i.e., to have the glass remain vitreous after up to about 30 minutes at its enameling temperature, is to obtain, while simultaneously providing a glass of the desired softness, while making possible a mix with the zircon. In a lead oxide-zinc oxide-borate glass, zinc oxide is desirable to contribute to the desired low expansion characteristic. However the amount used must be limited due to its adverse affect on resistance to devitrification. The $SiO_2$, BaO and CdO are used to improve resistance to devitrification. In the case of BaO and CdO the improvements in the resistance to devitrification resulting from substitutions for lead oxide are substantial for the first few percent of each substituted. However, more of either may not continue to be helpful while substantially more may even reduce the resistance to the devitrification. Substitution of the $SiO_2$ for the PbO hardens the glass while the BaO for PbO has little effect and the CdO for PbO softens the glass. The desired resistance to devitrification and softness is obtained by using a selected combination of $SiO_2$, BaO and CdO.

The raw materials used for making the glass are either reagent grade or high grade such as commonly used in the optical glass industry. The glasses are melted in an electric furnance at 900° C in a platinum crucible followed by mechanical stirring with a platinum propeller to obtain homogeneity. The crucible is removed from the furnance at 850° C and the molten glass poured into water to form a frit. The frit is then dried in an oven at about 100° C and then ground in a ball mill, screened through a 325 mesh sieve and the −325 glass mixed with about 36 to 40 percent zircon which preferably has a maximum particle size not over about 5 microns.

Specific examples of the base glass and its characteristics are shown in the following table:

|  | Example I | Example II |
|---|---|---|
| $SiO_2$ | 3 | 5 |
| PbO | 73 | 73 |
| ZnO | 6 | 6 |
| BaO | 3 | 1 |
| CdO | 2 | 2 |
| $TiO_2$ | 1 | 1 |
| $B_2O_3$ | 12 | 12 |
|  | 100 | 100 |
| Expansion $\times 10^{-7}/°$ C (Ave. 25-250°) | 105 | 105 |
| Anneal Point (by DTA) | 348° C | 360° C |
| Density | 6.25 | 6.18 |

Listed below are properties of two glass and zircon mixtures using Example I base glass. The zircon has a specific gravity of 4.5 and had been classified to have a particle size range of 0-3 microns. The test pieces were made by pressing the mixtures and firing in a furnance at 530° C for 30 minutes followed by annealing at 350° C.

|  | Example III Base Glass With 36 Volume % Zircon | Example IV Base Glass With 40 Volume % Zircon |
| --- | --- | --- |
| Expansion × 10 $^7$/° C (ave. 25-300° C) | 71 | 69 |
| Strength (MOR) on bars prepared with a 220 grit finish | 6300 psi | 7100 psi |
| Electrical Resistivity at 200 Volts $Log_{10}$ ohm-cm |  |  |
| at 25° C | 15.6 | 14.2 |
| at 150° C | 12.3 | 12.3 |
| at 190° C | 11.0 | 11.0 |

Either of the above examples provide suitable characteristics for insulating and passivating semiconductor devices. This is a great advantage to the industry, particularly in devices of the type more completely described in co-pending application Ser. No. 694,859 file SC-75879.

What is claimed is:

1. An insulating and passivating glass and zircon composition consisting of 36 to 40 volume percent of zircon of maximum particle size up to 5 microns and the balance a base glass of particle size less than 44 microns wherein said base glass consists of 3 percent-$SiO_2$, 73 percent-PbO, 6 percent-ZnO, 3 percent-BaO, 2 percent-CdO, 1 percent-$TiO_2$ and 12 percent-$B_2O_3$.

* * * * *